(12) United States Patent
Vitanov et al.

(10) Patent No.: US 11,949,009 B2
(45) Date of Patent: Apr. 2, 2024

(54) SEMICONDUCTOR DIE AND METHOD OF MANUFACTURING THE SAME

(71) Applicant: Infineon Technologies Austria AG, Villach (AT)

(72) Inventors: Stanislav Vitanov, Villach (AT); Jyotshna Bhandari, Villach (AT); Georg Ehrentraut, Villach (AT); Christian Ranacher, Gaimberg (AT)

(73) Assignee: Infineon Technologies Austria AG, Villach (AT)

( * ) Notice: Subject to any disclaimer, the term of this patent is extended or adjusted under 35 U.S.C. 154(b) by 287 days.

(21) Appl. No.: 17/482,481

(22) Filed: Sep. 23, 2021

(65) Prior Publication Data

US 2022/0102548 A1 Mar. 31, 2022

(30) Foreign Application Priority Data

Sep. 29, 2020 (EP) .................................... 20198987

(51) Int. Cl.
| | | |
|---|---|---|
| *H01L 29/78* | (2006.01) | |
| *H01L 27/06* | (2006.01) | |
| *H01L 29/40* | (2006.01) | |
| *H01L 29/66* | (2006.01) | |

(52) U.S. Cl.
CPC ...... *H01L 29/7813* (2013.01); *H01L 27/0629* (2013.01); *H01L 29/407* (2013.01); *H01L 29/66734* (2013.01)

(58) Field of Classification Search
CPC .......... H01L 29/7813; H01L 29/66734; H01L 29/407; H01L 27/0629
See application file for complete search history.

(56) References Cited

U.S. PATENT DOCUMENTS

| | | | |
|---|---|---|---|
| 9,825,027 B1* | 11/2017 | Fukunaga | ........... H01L 27/0727 |
| 2011/0291186 A1 | 12/2011 | Yilmaz et al. | |
| 2013/0075809 A1 | 3/2013 | Hsieh | |
| 2018/0301553 A1 | 10/2018 | Weyers et al. | |

* cited by examiner

*Primary Examiner* — Joseph C. Nicely
(74) *Attorney, Agent, or Firm* — Murphy, Bilak & Homiller, PLLC (57) ABSTRACT

This application relates to semiconductor die including: a transistor device formed in an active area of a semiconductor body and having a channel region, a gate region, and a field electrode region, the gate region arranged laterally aside the channel region and having a gate electrode for controlling a current flow in the channel region, the gate electrode formed in a gate trench extending into the semiconductor body; and an additional device formed in an additional device area of the semiconductor body. A recess extends into the semiconductor body in the additional device area, and a semiconductor material is arranged in the recess in which the additional device is formed.

16 Claims, 9 Drawing Sheets

SEMICONDUCTOR DIE AND METHOD OF MANUFACTURING THE SAME

TECHNICAL FIELD

The present disclosure relates to a semiconductor die with a semiconductor body in which a transistor device is formed.

BACKGROUND

In a vertical power field effect transistor, the gate electrode is formed in a gate trench extending into the semiconductor body. Laterally aside the gate region with the gate electrode, the channel region is arranged, isolated from the gate electrode by a gate dielectric in between. By applying a voltage to the gate electrode, a channel formation in the channel region and the vertical current flow can be controlled. In addition, the transistor device can comprise a field electrode region with a field electrode, e. g. for a field shaping.

SUMMARY

It is an object of the present application to provide an improved semiconductor die, as well as a method of manufacturing such a die.

In addition to the transistor device formed in an active area of the semiconductor body, the die comprises an additional device which is formed in an additional device area. In the additional device area, a recess extends into the semiconductor body, and the additional device is formed in a semiconductor material arranged in this recess.

Integrating the additional device into the same die can for instance simplify or improve a wiring of the additional device with the transistor device, and it can reduce the space required in a package or on a board. Instead of arranging the semiconductor material with the additional device simply on a frontside of the semiconductor body, the additional device is formed in the recess. This can reduce the topography, which is for instance advantageous in subsequent lithography steps. The surface planarity can in particular become critical for the contact layers due to a down-scaling of the transistor device structures. As an alternative, a step at the frontside could also be decreased by increasing the thickness of an insulation layer formed on the semiconductor body. However, an excessive increase of the insulation layer thickness would increase the complexity of the vertical interconnect formation.

Advantageous embodiments and features are provided throughout this disclosure. The disclosure relates to apparatus and device aspects, but also to method and use aspects. If for instance a die manufactured in a specific way is described, this is also a disclosure of a respective manufacturing process, and vice versa. In general words, an approach of this application is to form an additional device recessed in the same semiconductor body as a power device, in particular a vertical field effect transistor device.

In general, the additional device can be an active device, for instance a bipolar temperature sensor. In particular, it can be a passive device, e. g. without an amplifying effect or control function, for instance a resistor, e. g. gate resistor, or diode, e. g. ESD Diode. The semiconductor body can for instance comprise a semiconductor base material, e.g. silicon base material, optionally in combination with one or more epitaxial semiconductor layers. On the frontside of the semiconductor body, an insulation material layer can be formed, in particular an oxide e. g. silicon oxide, or borophosphosilicate glass (BPSG). On top of the insulation material layer, a frontside metallization can be arranged, serving for instance as a source contact in the active region.

The channel region can be formed in a body region arranged vertically between a source region and a drain region of the transistor device. The source and drain region are of a first conductivity type, and the body region is of a second conductivity type opposite to the first conductivity type. As a power device, the transistor can additionally comprise a drift region vertically between the body and the drain region, wherein the drift region is of the first conductivity type like the drain region but has a lower doping than the latter. In the illustrated embodiments, the first conductivity type is n-type and the second conductivity type is p-type. The source and the body region, and possibly the drift region, can be formed in an epitaxial layer or layers on the semiconductor base material.

The gate trench and the recess have a vertical extension in the semiconductor body, the "vertical" direction lying for instance perpendicular to a surface of the die, e. g. a surface of the (silicon) base material and/or a surface of an epitaxial layer formed on the base material. The vertical direction points from drain to source, namely upwards. "Higher" or "at a larger height" means at a smaller vertical distance from a frontside of the semiconductor body (where the source region is formed), and "deeper" or "at a smaller height" means at a larger vertical distance from the frontside. The "lateral" direction or directions lie perpendicular to the vertical direction, the device or die area being for instance taken laterally.

Seen in a top view, the semiconductor material with the additional device and the active area can be arranged laterally aside each other, the active area can for instance partly or fully enclose the additional device area. Seen in a vertical cross section, an additional device region formed of the semiconductor material in the additional device area is recessed, a lower end of the additional device region being for instance arranged at a smaller vertical height than an upper end or edge of the semiconductor body. The lower end of the additional device region can for instance be arranged at a smaller vertical height as an upper end of the gate electrode, for example at the same or even at a smaller vertical height as a lower end of the gate electrode. Vice versa, the lower end of the additional device region can for instance be arranged not deeper than a lower end of the field electrode region, e. g. at least on the same height or higher than the lower end of the field electrode. In particular, the lower end of the additional device region can be arranged not deeper than the upper end of the field electrode, e.g. at least on the same height or higher.

In an embodiment, the upper end of the additional device region formed of the semiconductor material is arranged at maximum at the same vertical height, e. g. not higher, as the upper end of the gate electrode. Vice versa, it can for instance be located at minimum at the same vertical height as the lower end of the gate electrode, namely not deeper, e. g. on a vertical position between the upper end and the lower end of the gate electrode. In other words, the semiconductor material of the additional device region is entirely embedded, a top surface being for instance leveled with a top surface in the active region. In particular, an insulation material layer formed on the semiconductor body can extend over the active and the additional device region and have a flat upper surface. The upper end of the semiconductor material of the additional device region can particularly be arranged at the same vertical height as an upper end of the gate electrode and/or an upper end of the semiconductor material in the active region, e. g. an upper end of the source region.

Embedding the semiconductor material can be advantageous for later lithography or for an integration of the additional device region with less restrictions on a minimum lateral distance to the active region, reducing for example an area consumption. It can also allow for a process-wise integration, e. g. a simultaneous device formation in the active area and in the additional device area, at least with one or some common process steps (for example a simultaneous implantation).

In an embodiment, the additional device region formed of the semiconductor material is embedded laterally and/or vertically downwards in an isolation well formed of an insulating material. In particular, a side wall of the isolation well, which contains the additional device region laterally, can be made of the same dielectric material as a gate dielectric of the gate region in the active area and/or as a field dielectric of the field electrode region in the active area. Alternatively or in addition, a bottom of the isolation well, which embeds the additional device region vertically downwards, can be made of the same insulating material as an insulating layer formed in the gate trench vertically between the gate electrode and the field electrode, see in detail below. This can for instance allow for an integration of process steps, e. g. a simultaneous processing in the active area and in the additional device area.

In an embodiment, a lower end of the field electrode is located at a smaller vertical height than a lower end of the additional device region formed of the semiconductor material. The field electrode can in particular be arranged in the same gate trench as the gate electrode, e. g. vertically below and isolated from the gate electrode by an insulation layer. Generally, the gate trench can be a longitudinal trench, extending longitudinally in a lateral direction, the field electrode arranged below the gate electrode having a plate-like shape then.

In an embodiment, an additional device field electrode region is formed in the additional device area vertically below the additional device region. The field electrode of this field electrode region can be formed of an electrically conductive material, for instance polysilicon. In addition, this field electrode region can comprise a field dielectric isolating the additional field electrode from the semiconductor body, e. g. from the drift region. The additional device field electrode region can allow for a shielding of the additional device region so that for instance a required dielectric thickness can be reduced. In particular, the field electrode of the additional device field electrode region can be made of the same electrode material like the field electrode or electrodes in the active area (e. g. "first silicon material", see below). Alternatively or in addition, the field dielectric of the additional device field electrode region can be made of the same dielectric material like the field dielectric of the field electrode regions in the active area, e. g. silicon oxide.

In an embodiment, the field electrode of the additional device field electrode region is on the same electrical potential as the field electrode or the gate electrode of the transistor device. In particular, the field electrode of the additional device field electrode region can be on source potential, e. g. together with the field electrode of the transistor device. Alternatively, it can be on gate potential, together with the gate electrode of the transistor device.

In an embodiment, a plurality of vertical trench recesses are formed in the semiconductor body below the additional device region. A "vertical trench recess" is a lower part of a vertical trench. In the upper part, the remaining portion of the semiconductor body that separated the trenches initially has been etched away to form the recess, see in detail below. The lower end of a respective vertical trench recesses can in particular be arranged on the same vertical height as the lower end of the gate trench in the active region. In the active area, the gate trenches can be arranged consecutively in a first lateral direction, having their respective length extension in a second lateral direction perpendicular thereto. The plurality of trench recesses formed in the additional device area can respectively have a longitudinal extension as well, in particular in the second lateral direction while being arranged consecutively in the first lateral direction.

The vertical trench recesses are filled, in general they could be filled with a dielectric material completely. In particular, the additional device field electrode region or regions are formed there, for instance a separate additional device field electrode region in each trench recess. The trench recesses can be a residuum of an advantageous simultaneous processing in the active area and in the additional device area, but they can also be used for a further purpose (field electrode formation).

In an embodiment, the plurality of trench recesses formed below the additional device region are arranged in the same pattern like the plurality of gate trenches in the active area. This relates to a lateral arrangement, the trench recesses can in particular have the same lateral distance to each other like the gate trenches in the active area. Seen in a vertical cross-section, the distance can for instance be taken in the first lateral direction as a center-to-center distance at the bottom of the gate trenches or trench recesses, respectively. The arrangement of the trenches and trench recesses in the same pattern, e. g. the same pattern density, can for example be advantageous regarding a homogeneous etch behavior.

In an embodiment, only passive devices are formed in the additional device region, no active device being formed there. This can in particular apply for the semiconductor die as a whole, so that no active device is formed in the semiconductor die apart from the transistor device in the active area. A "passive" device has for instance no amplifying effect or control function.

The application also relates to a method of manufacturing a semiconductor die, comprising the steps:
etching the vertical gate trench into the semiconductor body in the active area,
forming the gate region with the gate electrode in the gate trench, in particular after forming the field electrode region in a lower part of the gate trench before,
etching the recess into the semiconductor body in the additional device area,
depositing the semiconductor material into the recess to form the additional device region there.

In an embodiment, the vertical gate trench or trenches in the active area are etched at the same time as a plurality of vertical trenches in the additional device area. The gate trenches in the active area and the plurality of vertical trenches in the additional device area can be arranged in the same pattern, see above. At the end of this etch step, the plurality of vertical trenches and the gate trench or trenches in the active area can have the same depth. They can in particular extend deeper than the recess in which the additional device region is formed later on.

In an embodiment, the vertical trenches of the additional device area and the gate trench or trenches are subsequently filled with a first silicon material, particularly polysilicon. In the ready-made die, the first silicon material can form the field electrodes in the active area, and it can in particular form the additional field electrode below the additional device region. When the first silicon material is deposited into the trenches, the trenches can for instance be filled with the first silicon material up to their upper ends.

After depositing the first silicon material, the latter can be etched back in a subsequent etch back step. With this etch back step, the first silicon material can be removed from an upper part of the trenches, so that for instance an upper end of the field electrodes is defined in the etch back step. A lower part of the trenches remains filled at the end of the etch back step, the remaining first silicon material forming the field electrodes there.

In an embodiment, the recess etch according to step iii) is done in the etch back step. In the active area, the etch back step can act only on the fillers of the trenches, e. g. on the first silicon material in the trenches. The area between the trenches can be protected from the etch chemistry, for instance by a hard mask. In contrast, in the additional device area, the etch back chemistry can act on the fillers of the trenches but also on the remaining semiconductor body arranged between the trenches, the semiconductor body being not protected by the hard mask there. This process integration can allow for a reuse of an existing etch back step. The recess etch can be implemented with only one additional lithography step, e. g. for opening the hard mask in the additional device area (in the active area, the hard mask defines the trenches). The hard mask can for instance be formed on the semiconductor body, e. g. as a field oxide layer. It can be opened in a chemical or plasma-etch process. In an embodiment, the same hard mask can be used for etching the plurality of vertical trenches in the additional device area and the gate trenches in the active area.

In an embodiment, the gate trench or gate trenches in the active area and the recess formed in the additional device area are simultaneously filled with a second semiconductor material, in particular polysilicon. Likewise, the gate electrode in the active area and the additional device region are formed simultaneously.

BRIEF DESCRIPTION OF THE DRAWINGS

Below, the semiconductor die and the manufacturing of the same are explained in further detail by means of exemplary embodiments. Therein, the individual features can also be relevant for this application in a different combination.

DETAILED DESCRIPTION

Figure 1:
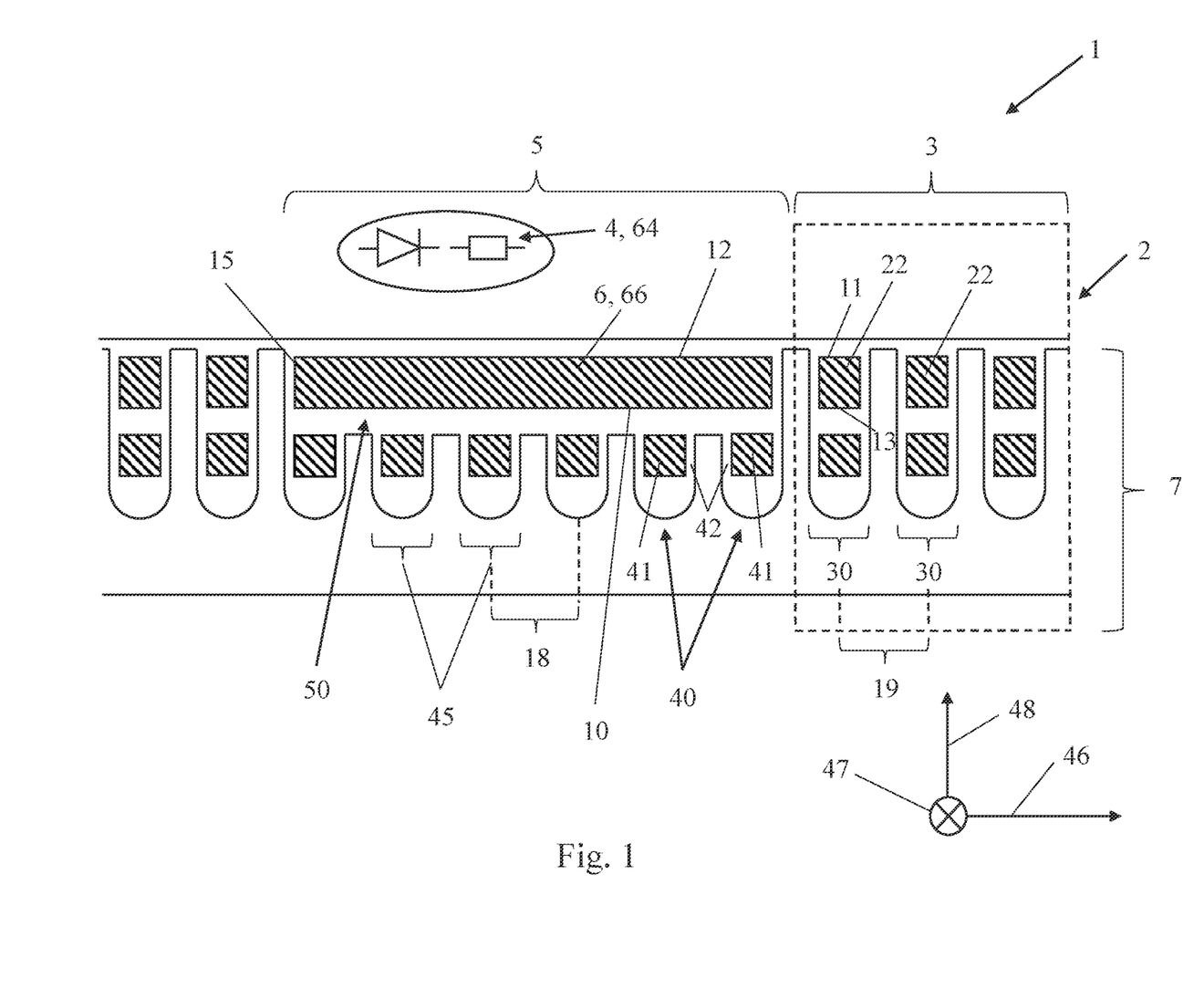
FIG. 1 shows a vertical cross-section through a semiconductor die comprising a transistor device in an active area and an additional device region.

FIG. 1 shows a portion of a semiconductor die 1 in a vertical cross-section. The semiconductor die 1 comprises a transistor device 2 formed in an active area 3 of a semiconductor body 7. The transistor device 2 is detailed below with reference to FIG. 2. In addition to the active area 3, the semiconductor die 1 of FIG. 1 comprises an additional device area 5. There, a semiconductor material 6 is arranged in a recess 50, forming an additional device region 66. In this semiconductor material 6 or region 66, an additional device 4 can be formed, in particular a passive device 64 like a resistor or diode.

Since the additional device region 66 made of the semiconductor material 6 is arranged in the recess 50, a basically planar topography is obtained. In particular, an upper end 12 of the semiconductor material 6 or additional device region 66 can be arranged at the same vertical height as an upper end 11 of a gate electrode 22 of the transistor device 1. Moreover, in the example shown here, a lower end 10 of the semiconductor material 6 or additional device region 66 is arranged at the same vertical height as a lower end 13 of the gate electrode 22. Laterally and downwards, the semiconductor material 6 or additional device region 66 is embedded in an isolation well 15, 67.

Below the semiconductor material 6 or additional device region 66, a plurality of vertical trench recesses 45 are formed. In these trench recesses 45, a respective additional device field electrode region 40 is arranged, which can allow for a shielding of the semiconductor material 6 or additional device region 66. Each additional device field electrode region 40 comprises a field electrode 41 and a field dielectric 42 isolating the field electrode 41 from the semiconductor body 7. The field electrodes 41 can for instance be on source or gate potential.

The plurality of trench recesses 45 are arranged consecutively in a first lateral direction 46. In a second lateral direction 47 perpendicular thereto and to the vertical direction 48, they respectively extend longitudinally. In the active area 3, the gate trenches 30 comprising the gate electrodes 22 extend vertically to the same depth like the trench recesses 45 in the additional device area 5, which results from a simultaneous processing, see FIGS. 3a-f. Moreover, the gate trenches 30 and the trench recesses 45 are arranged in the same pattern, a lateral distance 18 between the vertical trench recesses 45 being the same like a lateral distance 19 between the vertical gate trenches 30.

Figure 2:
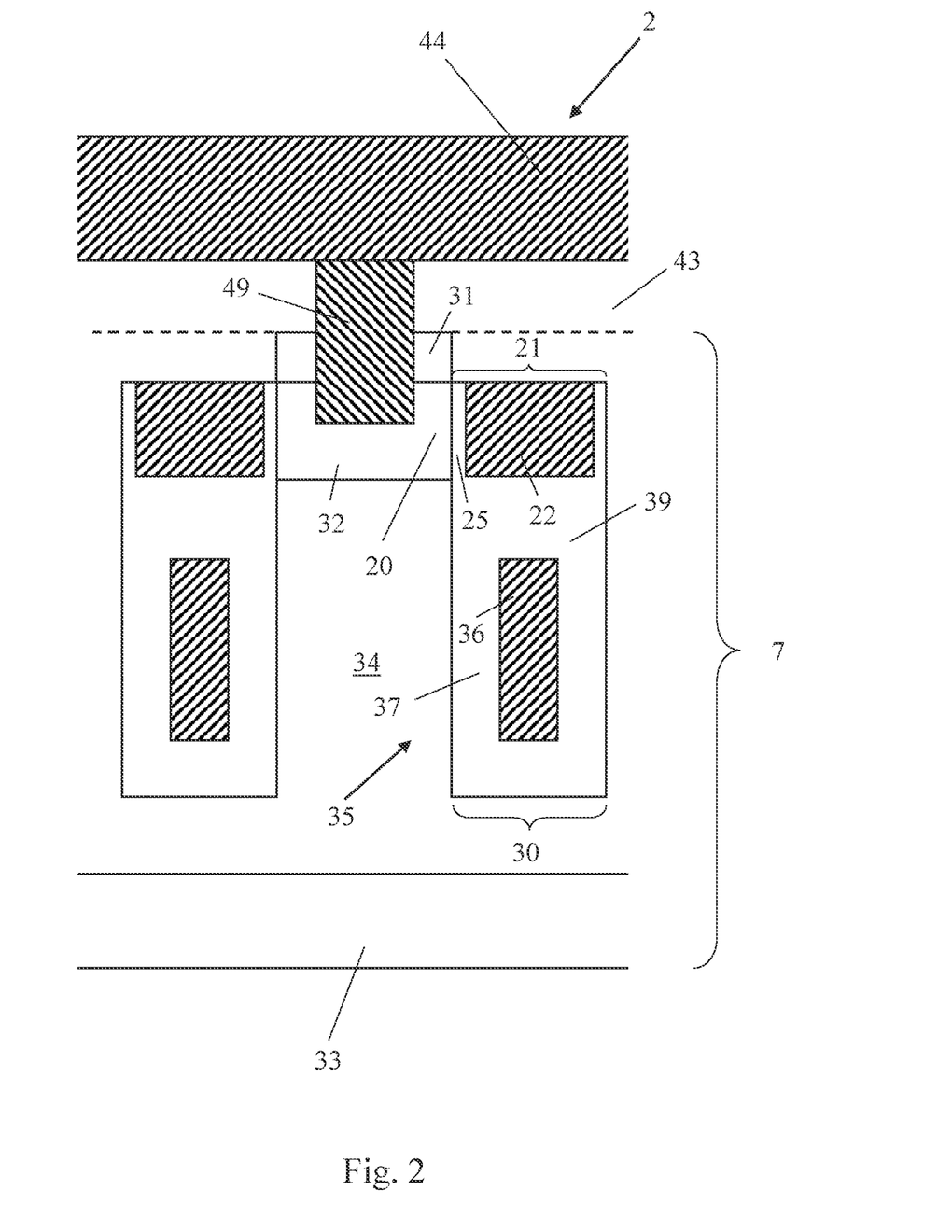
FIG. 2 shows a detailed view of the transistor device in the active area.

FIG. 2 shows a detailed view of the transistor device 2 formed in the active area 3. In the semiconductor body 7, a source region 31 and a body region 32 are formed, the latter comprising a channel region 20. Vertically below, a drain region 33 is formed, wherein a drift region 34 is arranged between the body region 32 and the drain region 33. The drift region 34 has the same majority carrier type like the drain region 33 but a lower doping concentration. The vertical gate trenches 30 and trench recesses 45 discussed above extend into the drift region 34. In the example here, the source region 31, the drain region 33 and the drift region 34 are n-type and the body region 32 is p-type.

For controlling a current flow in the channel region 20, the gate electrode 22 is arranged laterally aside in the gate trench 30. In addition to the gate electrode 22, the gate region 21 comprises a gate dielectric 25 which capacitively couples the gate electrode 22 to the channel or body region 20, 32. A field electrode region 35 is formed below the gate electrode 22 in the same gate trench 30. It comprises a field electrode 36 and a field dielectric 37 isolating the field electrode 36 from the drift region 34. In the gate trench 30, an insulating layer 39 is arranged between the gate electrode 22 and the field electrode 36, e. g. silicon oxide.

On the semiconductor body 7, an insulation layer 43 is formed, for instance BPSG. On the insulation layer 43, a frontside metallization 44 is arranged, e. g. aluminium, forming a source contact. Via a vertical interconnect 49, the source contact is electrically connected to the source region 31 and, in this example, to the body region 32. The source region 31, the body region 32 and the drift region 34 can be formed in an epitaxial layer or layers of the semiconductor body 7. The gate electrode 22 and the field electrode 36 can in particular be made of polysilicon.

FIGS. 3a-f illustrate the formation of the additional device region 66. In the process step shown in FIG. 3a, the gate trenches 30 have already been etched in the active area 3. Simultaneously, a plurality of vertical trenches 55 have been etched in the additional device area 5. In the trenches 30, 55, a dielectric material 54 has been formed or deposited, for instance silicon oxide. In the ready-made device, this dielectric material 54 can form the field dielectric 37 of the field electrode region 35 and the field dielectric 42 of the additional device field electrode region 40. Additionally, a first silicon material 56 has been deposited into the trenches 30, 55, filling the trenches 30, 55 up to their upper end.

Figure 3A:
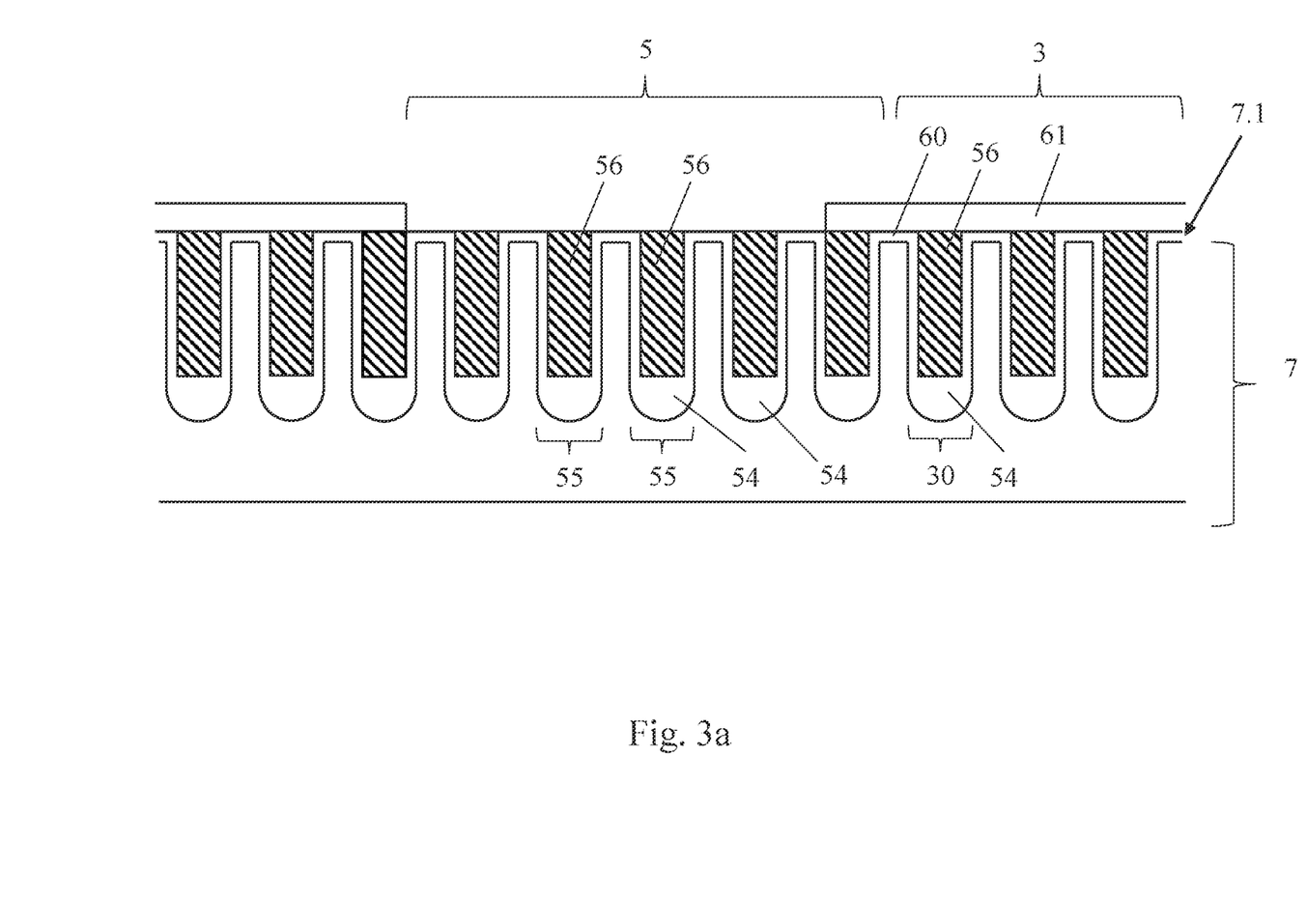
FIGS. 3a-f illustrate consecutive process steps for the manufacturing of the semiconductor die.

On a frontside 7.1 of the semiconductor body 7, a hard mask 60 is arranged. Up to the process step shown in FIG. 3a, the hard mask 60 has only been opened where the trenches 30, 55 have been etched. Laterally in between, the semiconductor body 7 has been protected by the hard mask 60. Now, the hard mask 60 will be opened in the additional device area 5 for etching the recess 50 there. For that purpose, a photoresist layer 61 is formed on the hard mask 60 and structured as shown in FIG. 3a, namely opened in the additional device area 5.

Figure 3B:
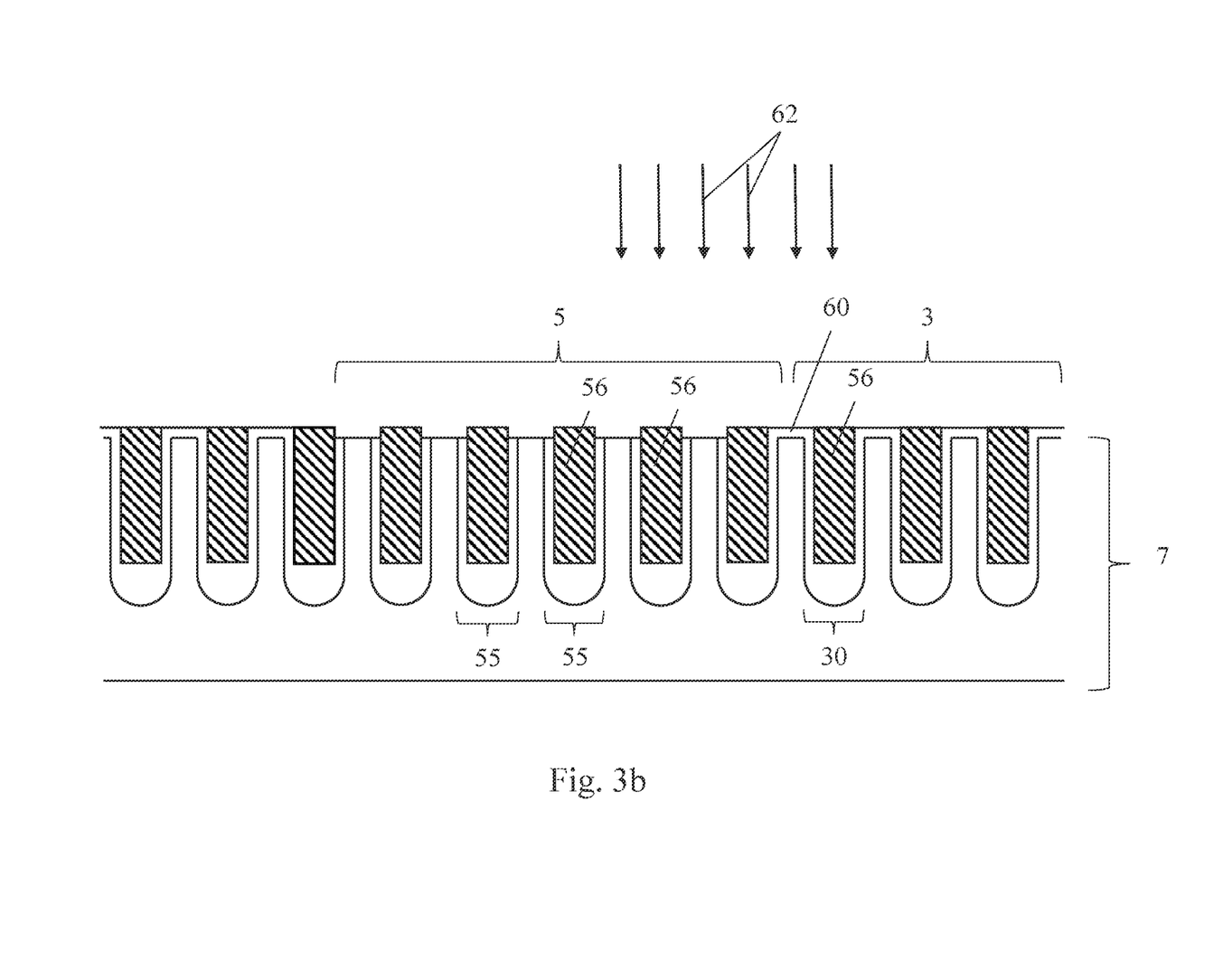

After opening the hard mask 60 in a wet-chemical or plasma-etch process, the photoresist layer 61 can be removed, as shown in FIG. 3b. In a subsequent etch back step, the first silicon material 56 arranged in the trenches 30, 55 is etched back. In the active area 3, the remaining hard mask 60 protects the semiconductor body 7 from the etch chemistry 62. In contrast, in the additional device area 5, the etch chemistry 62 attacks also the semiconductor body 7 between the vertical trenches 55. Consequently, the recess 50 is etched in the additional device area 5, as shown in FIG. 3c.

Figure 3C:
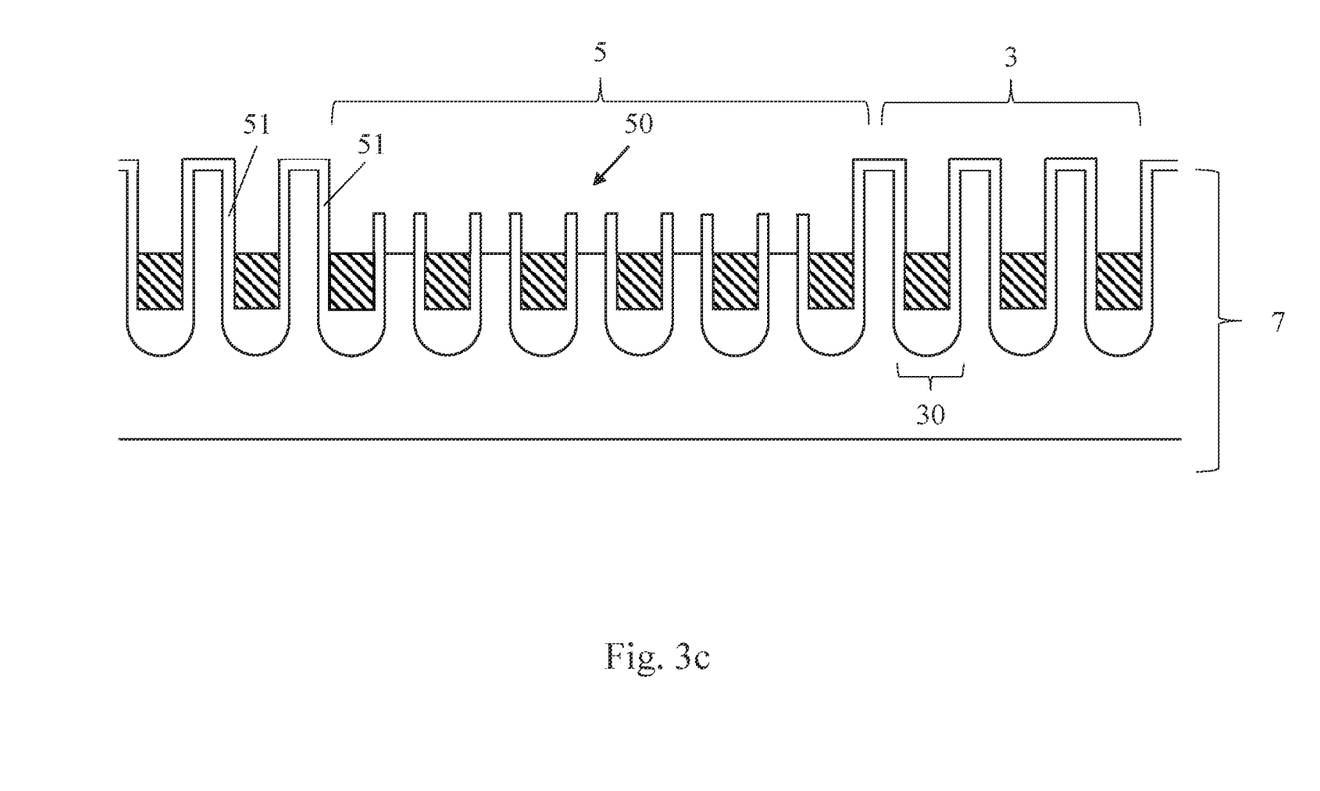
Figure 3D:
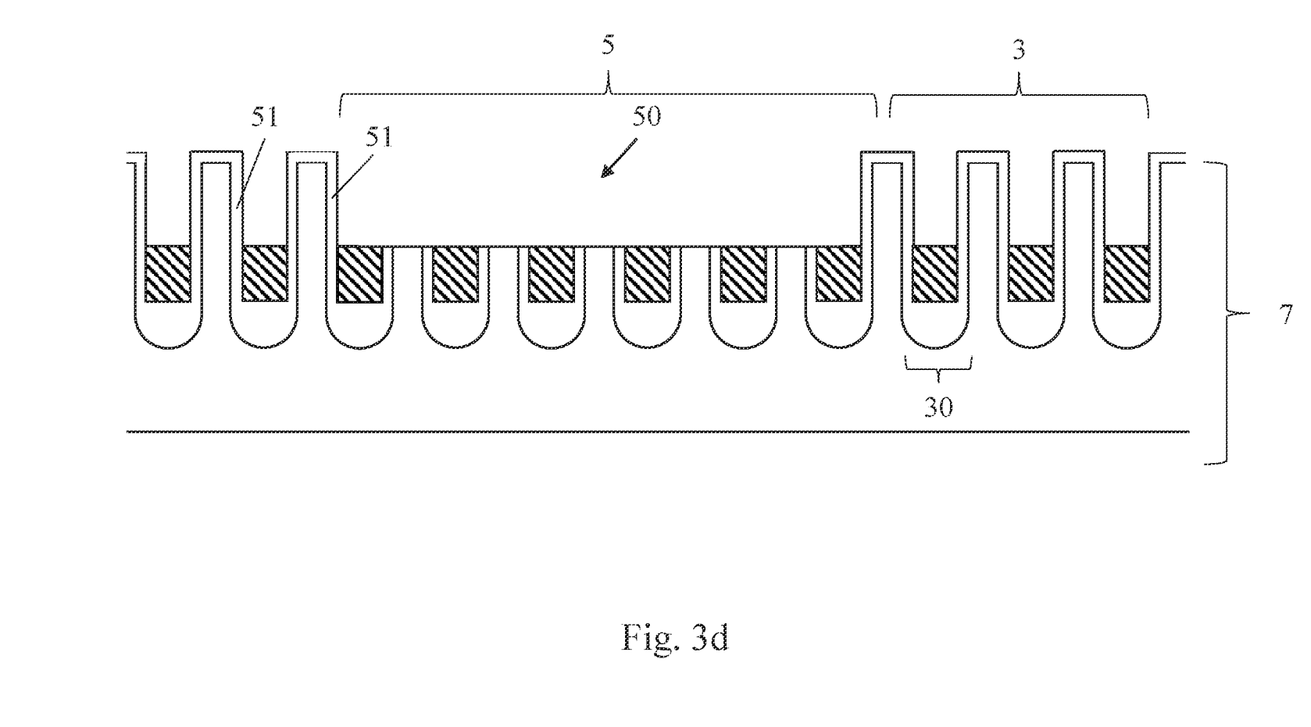
Figure 3E:
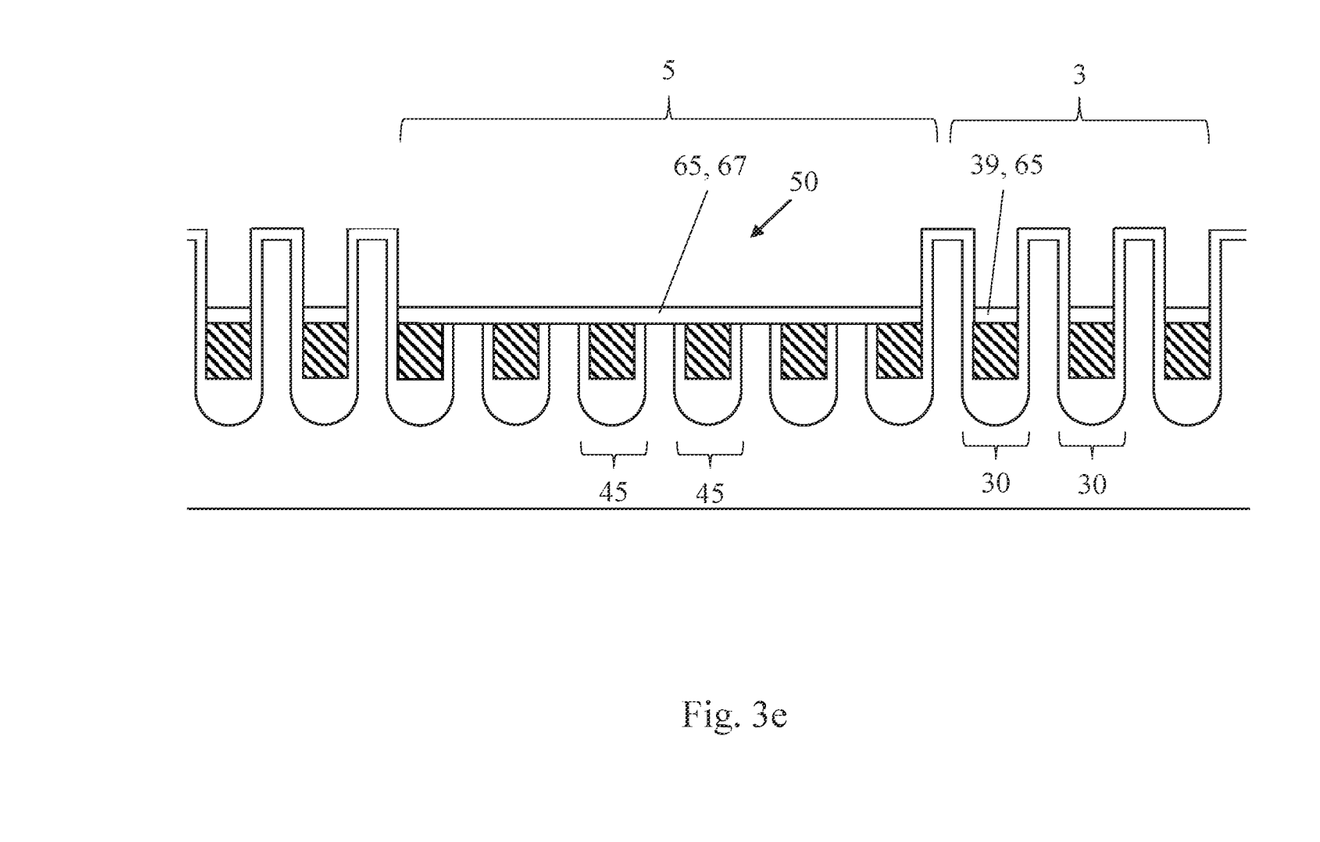

The comparably thin remaining oxide walls shown at the bottom of the recess 50 in FIG. 3c will break and can for instance be removed by rinsing, which results in the structure shown in FIG. 3d. Subsequently, an insulation layer material 65 can be deposited into the gate trenches 30 for forming the insulation layer 39 there, as shown in FIG. 3e. Simultaneously, the same insulation layer material 65 is deposited into the recess 50 to form the bottom 67 of the isolation well 15, 67 there, see FIG. 1 for comparison.

Figure 3F:
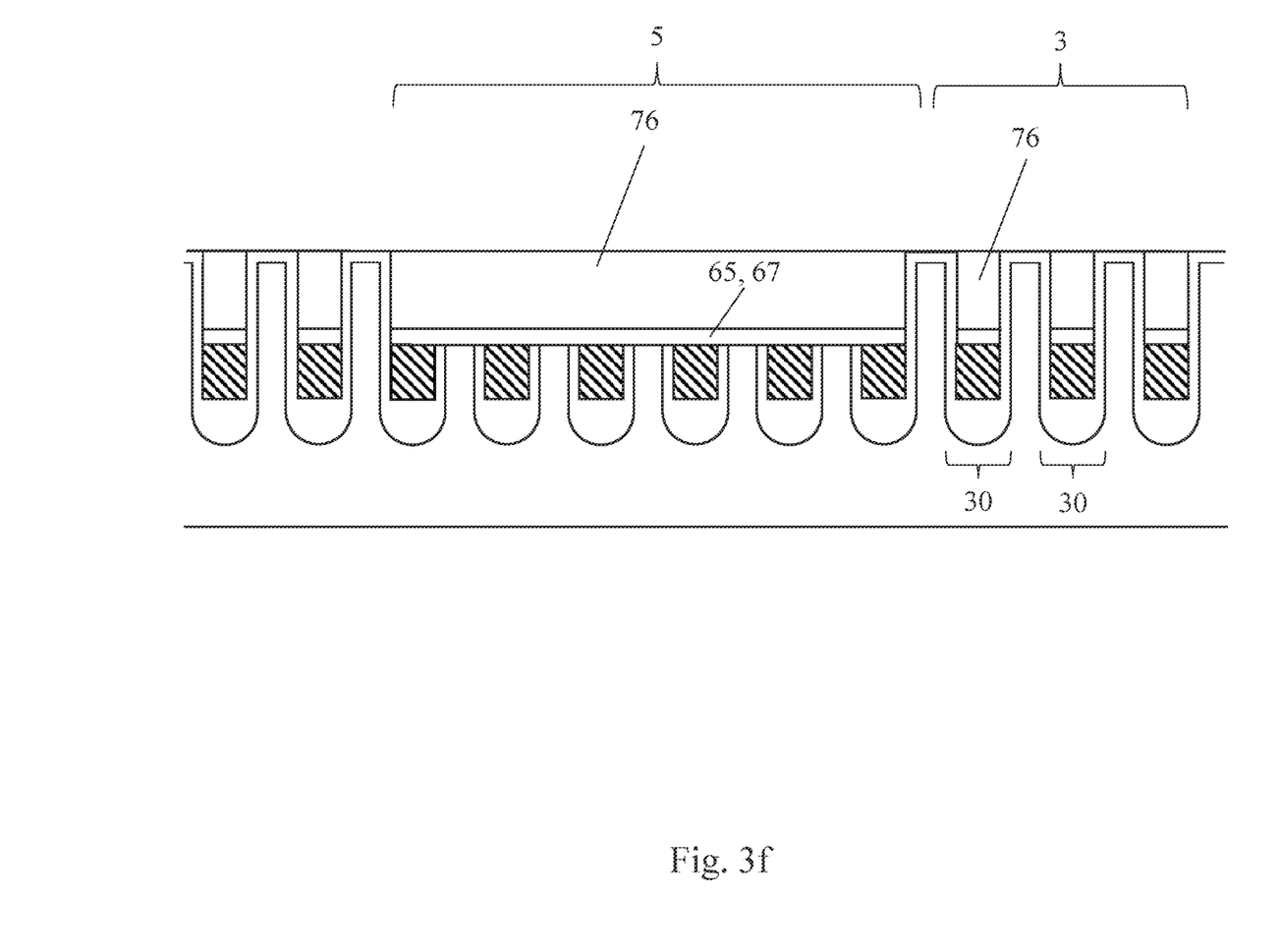

Subsequently, a second silicon material 76 is deposited into the gate trenches 30 and into the recess 50, as shown in FIG. 3f. In the recess 50, the second semiconductor material 76 forms the semiconductor material 6 or additional device region 66, respectively. In the gate trenches 30, the second semiconductor material 76 forms the gate electrodes 22.

Figure 4:
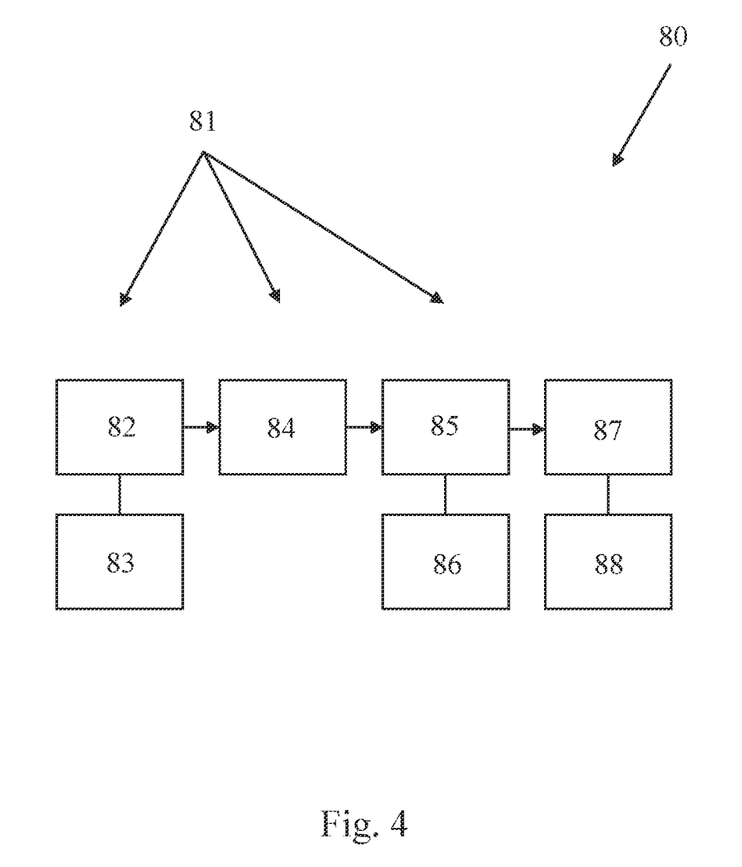
FIG. 4 shows a flow diagram summarizing process steps for the manufacturing of the semiconductor die.

The flow diagram 80 of FIG. 4 summarizes some of the processing steps 81 for manufacturing the die 1. When the gate trenches 30 are etched 82 in the active area 3, the vertical trenches 55 are simultaneously etched 83 in the additional device area 5. Subsequently, the hard mask 60 is opened 84 in the additional device area 5. Thereafter, when the first silicon material 56 is etched back 85 in the trenches 30, 55 the etching 86 of the recess 50 is done at the same time. Subsequently, the gate region 21 with a gate electrode 22 can be formed 87 in the gate trench 30, the semiconductor material 6 being simultaneously deposited 88 into the recess 50 to form the additional device region 66.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die, comprising:
   a transistor device formed in an active area of a semiconductor body and having a channel region, a gate region, and a field electrode region, the gate region arranged laterally aside the channel region and having a gate electrode for controlling a current flow in the channel region, the gate electrode formed in a gate trench extending into the semiconductor body; and
   an additional device formed in an additional device area of the semiconductor body,
   wherein a recess extends into the semiconductor body in the additional device area,
   wherein a semiconductor material is arranged in the recess in which the additional device is formed,
   wherein a plurality of vertical trench recesses are formed in the semiconductor body below the semiconductor material.

2. The semiconductor die of claim 1, wherein an upper end of the semiconductor material arranged in the recess is located at maximum at a same vertical height as an upper end of the gate electrode.

3. The semiconductor die of claim 1, wherein the semiconductor material is laterally embedded in an isolation well formed in the semiconductor body, and wherein the isolation well comprises the same dielectric material as a gate dielectric of the gate region.

4. The semiconductor die of claim 1, wherein a lower end of a field electrode of the field electrode region is located at a smaller vertical height as a lower end of the semiconductor material.

5. The semiconductor die of claim 1, wherein an additional device field electrode region is formed in the additional device area vertically below the semiconductor material.

6. The semiconductor die of claim 1, wherein a lower end of a field electrode of the field electrode region is located at a smaller vertical height as a lower end of the semiconductor material, wherein an additional device field electrode region is formed in the additional device area vertically below the semiconductor material, and wherein a field electrode of the additional device field electrode region and the field electrode of the transistor device or the gate electrode of the transistor device are on the same electrical potential.

7. The semiconductor die of claim 1, wherein a plurality of gate trenches are formed in the active area, and wherein the plurality of gate trenches and the plurality of vertical trench recesses are arranged in a same pattern.

8. The semiconductor die of claim 1, wherein exclusively passive devices are formed in the semiconductor material.

9. A method of manufacturing a semiconductor die including a transistor device formed in an active area of a semiconductor body and having a channel region, a gate region, and a field electrode region, the gate region arranged laterally aside the channel region and having a gate electrode for controlling a current flow in the channel region; and an additional device formed in an additional device area of the semiconductor body, the method comprising:
   etching a gate trench into the semiconductor body in the active area;

during etching of the gate trench, simultaneously etching a plurality of vertical trench recesses into the semiconductor body in the additional device area;

forming the gate region with the gate electrode in the gate trench;

etching a recess into the semiconductor body in the additional device area; and depositing a semiconductor material into the recess above the plurality of vertical trench recesses.

10. The method of claim 9, further comprising:

after etching the gate trench and the plurality of vertical trenches, filling the gate trench and the plurality of vertical trenches with a first silicon material; and subsequently etching the first silicon material in a subsequent etch back step.

11. The method of claim 10, wherein the etching of the recess is done in the etch back step.

12. The method of claim 11, further comprising:

opening, in the additional device area prior to the etch back step, a hard mask that defines the gate trench and the plurality of vertical trenches.

13. The method of claim 9, further comprising:

simultaneously filling the gate trench and the recess with a silicon material, wherein the gate electrode in the active area and the semiconductor material in the additional device area formed simultaneously.

14. A semiconductor die, comprising:

a transistor device formed in an active area of a semiconductor body and having a channel region, a gate region, and a field electrode region, the gate region arranged laterally aside the channel region and having a gate electrode for controlling a current flow in the channel region, the gate electrode formed in a gate trench extending into the semiconductor body; and an additional device formed in an additional device area of the semiconductor body, wherein a recess extends into the semiconductor body in the additional device area, wherein a semiconductor material is arranged in the recess in which the additional device is formed, and wherein the additional device is formed entirely in the semiconductor material arranged in the recess.

15. The semiconductor die of claim 14, wherein the additional device is a resistor.

16. The semiconductor die of claim 14, wherein the additional device is a diode.

* * * * *